US011307696B2

United States Patent
Won et al.

(10) Patent No.: US 11,307,696 B2
(45) Date of Patent: Apr. 19, 2022

(54) DISPLAY DEVICE WITH INTEGRATED TOUCH SCREEN AND METHOD OF MANUFACTURING THE SAME

(71) Applicant: LG Display Co., Ltd., Seoul (KR)

(72) Inventors: Sanghyuk Won, Gimpo-si (KR);
JaeWon Lee, Goyang-si (KR);
Byonghoo Kim, Paju-si (KR);
Hyangmyoung Gwon, Paju-si (KR);
SangHoon Pak, Seoul (KR);
Jeonghoon Lee, Gimpo-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/090,538

(22) Filed: Nov. 5, 2020

(65) Prior Publication Data

US 2021/0055818 A1 Feb. 25, 2021

Related U.S. Application Data

(63) Continuation of application No. 16/023,304, filed on Jun. 29, 2018, now Pat. No. 10,860,123.

(30) Foreign Application Priority Data

Jun. 30, 2017 (KR) .................. 10-2017-0083193

(51) Int. Cl.
*G06F 3/041* (2006.01)
*G06F 3/044* (2006.01)
(Continued)

(52) U.S. Cl.
CPC ............ *G06F 3/0412* (2013.01); *G06F 3/044* (2013.01); *H01L 27/13* (2013.01); *H01L 27/323* (2013.01);
(Continued)

(58) Field of Classification Search
CPC ...... G06F 3/0412; G06F 3/0416; G06F 3/044; G06F 3/0443; G06F 3/0446;
(Continued)

(56) References Cited

U.S. PATENT DOCUMENTS 9,058,074 B2 6/2015 Choi
10,061,416 B2 8/2018 Zhu et al.
(Continued)

FOREIGN PATENT DOCUMENTS

CN 103681735 A 3/2014
CN 104750285 A 7/2015
(Continued)

*Primary Examiner* — Stacy Khoo
(74) *Attorney, Agent, or Firm* — Seed Intellectual Property Law Group LLP

(57) ABSTRACT

Disclosed are a display device with integrated touch screen and a method of manufacturing the same, which prevent the partial detachment of an organic layer. The display device includes a light emitting device layer including a first electrode disposed on a first substrate, a light emitting layer disposed on the first electrode, and a second electrode disposed on the light emitting layer and a touch sensing layer disposed on the light emitting device layer. The touch sensing layer includes a first touch electrode layer, a second touch electrode layer, and a touch insulation layer disposed therebetween, and the touch insulation layer includes a touch inorganic layer covering the second touch electrode layer and a touch organic layer disposed on the touch inorganic layer.

8 Claims, 11 Drawing Sheets

(51) Int. Cl.
 *H01L 27/32* (2006.01)
 *H01L 27/13* (2006.01)
 *H01L 51/00* (2006.01)
 *H01L 51/52* (2006.01)

(52) U.S. Cl.
 CPC ...... *H01L 27/3227* (2013.01); *H01L 51/0001* (2013.01); *H01L 51/5256* (2013.01); *G06F 2203/04103* (2013.01); *H01L 27/3216* (2013.01)

(58) Field of Classification Search
 CPC . G06F 2203/04103; G06F 2203/04111; H01L 27/13; H01L 27/3213; H01L 27/3227; H01L 27/323; H01L 27/3246; H01L 51/0001; H01L 51/5253; H01L 51/5256; H01L 2227/323; H01L 27/3216
 See application file for complete search history.

(56) References Cited

U.S. PATENT DOCUMENTS

| | | | |
|---|---|---|---|
| 10,572,042 B2 | 2/2020 | Li et al. | |
| 10,599,278 B2 | 3/2020 | Xu et al. | |
| 10,649,569 B2 | 5/2020 | Park et al. | |
| 2014/0078077 A1* | 3/2014 | Choi | H01L 27/323 345/173 |
| 2014/0145979 A1 | 5/2014 | Lee | |
| 2015/0060806 A1* | 3/2015 | Park | H01L 27/3246 257/40 |
| 2015/0185915 A1 | 7/2015 | Lim | |
| 2016/0103537 A1 | 4/2016 | Park et al. | |
| 2016/0195983 A1 | 7/2016 | Miyake | |
| 2017/0003800 A1 | 1/2017 | Zhu | |
| 2017/0060340 A1 | 3/2017 | Chen et al. | |
| 2017/0115818 A1 | 4/2017 | Cai et al. | |
| 2017/0277341 A1 | 9/2017 | Lim et al. | |
| 2017/0278900 A1 | 9/2017 | Yang et al. | |
| 2017/0371463 A1 | 12/2017 | Choi | |
| 2018/0005772 A1* | 1/2018 | Jeong | G06F 3/044 |
| 2018/0033830 A1* | 2/2018 | Kim | G06F 3/0446 |
| 2018/0083088 A1 | 3/2018 | Bae et al. | |

FOREIGN PATENT DOCUMENTS

| | | |
|---|---|---|
| CN | 106057845 A | 10/2016 |
| CN | 106201114 A | 12/2016 |
| CN | 106201142 A | 12/2016 |
| CN | 106293268 A | 1/2017 |
| CN | 106449712 A | 2/2017 |
| CN | 106527790 A | 3/2017 |
| CN | 106654041 A | 5/2017 |
| KR | 10-2010-0052641 A | 5/2010 |

* cited by examiner

DISPLAY DEVICE WITH INTEGRATED TOUCH SCREEN AND METHOD OF MANUFACTURING THE SAME

CROSS-REFERENCE TO RELATED APPLICATIONS

This application is a continuation of U.S. patent application Ser. No. 16/023,304, filed Jun. 29, 2018, which claims the benefit of the Korean Patent Application No. 10-2017-0083193 filed on Jun. 30, 2017, which is hereby incorporated by reference as if fully set forth herein.

BACKGROUND

Technical Field

The present disclosure relates to a display device with integrated touch screen and a method of manufacturing the same.

Description of the Related Art

With the advancement of information-oriented society, various requirements for display devices for displaying an image are increasing. Consequently, various display devices such as liquid crystal display (LCD) devices, plasma display panel (PDP) devices, and organic light emitting display devices are being used recently. The organic light emitting display devices have characteristics where driving is performed with a low voltage, a thickness is thin, a viewing angle is good, and a response time is fast.

The organic light emitting display devices each include a display panel which includes a plurality of data lines, a plurality of scan lines, and a plurality of pixels respectively provided in a plurality of pixel areas defined by intersections of the data lines and the scan lines, a scan driver which respectively supplies scan signals to the scan lines, and a data driver which respectively supplies data voltages to the data lines. Each of the pixels includes an organic light emitting device, a driving transistor which controls the amount of current supplied to the organic light emitting device according to a voltage of a gate electrode, and a scan transistor which supplies a data voltage of a corresponding data line to the gate electrode of the driving transistor in response to a scan signal of a corresponding scan line.

Recently, the organic light emitting display devices are implemented as display devices with integrated touch screen, which includes a touch screen panel capable of sensing a user touch. In this case, the organic light emitting display devices function as touch screen devices. Recently, the touch screen devices are applied to monitors such as navigations, industrial terminals, notebook computers, financial automation equipment, and game machines, portable terminals such as portable phones, MP3 players, personal digital assistants (PDAs), portable multimedia players (PMPs), play station portables (PSPs), portable game machines, digital multimedia broadcasting (DMB) receivers, and tablet personal computers (PCs), and home appliances such as refrigerators, microwave ovens, and washing machines. Since all users can easily manipulate the touch screen devices, the application of the touch screen devices is being progressively expanded.

Display devices with integrated touch screen each include a plurality of first touch electrodes, a plurality of second touch electrodes, and a plurality of bridge electrodes for connecting the first touch electrodes to the second touch electrodes, which are provided in a display panel. The first touch electrodes may be Tx electrodes, and the second touch electrodes may be Rx electrodes.

The first touch electrodes and the second touch electrodes may be provided on the same layer, and the bridge electrodes may be provided on a layer which differs from a layer on which the first touch electrodes and the second touch electrodes are provided. In this case, in order to insulate the first and second touch electrodes from the bridge electrodes, an organic layer may be provided between the first and second touch electrodes and the bridge electrodes. For example, as in FIG. 1, an organic layer PAC may be provided on bridge electrodes BE, and a first touch electrode TE and a second touch electrode may be provided on the organic layer PAC. Alternatively, the organic layer PAC may be provided on the first touch electrode TE and the second touch electrode, and the bridge electrodes BE may be provided on the organic layer PAC. In this case, an interface adhesive force between the organic layer PAC and the first touch electrode TE, the second touch electrode, or the bridge electrodes BE is not high, and due to this, as in FIG. 1, the organic layer PAC can be partially detached from the first touch electrode TE, the second touch electrode, or the bridge electrodes BE.

BRIEF SUMMARY

Accordingly, the present disclosure is directed to provide a display device with integrated touch screen and a method of manufacturing the same that substantially obviate one or more problems due to limitations and disadvantages of the related art.

In one or more embodiments, the present disclosure provides a display device with integrated touch screen and a method of manufacturing the same, which prevent the partial detachment of an organic layer.

Additional advantages and features of the disclosure will be set forth in part in the description which follows and in part will become apparent to those having ordinary skill in the art upon examination of the following or may be learned from practice of the disclosure. The objectives and other advantages of the disclosure may be realized and attained by the structure particularly pointed out in the written description and claims hereof as well as the appended drawings.

To achieve these and other advantages and in accordance with the purpose of the disclosure, as embodied and broadly described herein, in one embodiment, a display device with integrated touch screen is provided, the display device including a light emitting device layer including a first electrode disposed on a first substrate, a light emitting layer disposed on the first electrode, and a second electrode disposed on the light emitting layer and a touch sensing layer disposed on the light emitting device layer. The touch sensing layer includes a first touch electrode layer, a second touch electrode layer, and a touch insulation layer between the first and second touch electrode layers. The touch insulation layer includes a touch inorganic layer covering the second touch electrode layer and a touch organic layer disposed on the touch inorganic layer.

In another embodiment of the present disclosure, there is provided a method that includes: forming a first electrode on a first substrate; forming a light emitting layer on the first electrode; forming a second electrode on the light emitting layer; forming a first touch electrode layer on the second electrode; forming a touch insulation layer on the first touch electrode layer; and forming a second touch electrode layer on the touch insulation layer. The forming of the touch insulation layer includes forming a touch inorganic layer covering the first touch electrode layer and forming a touch organic layer on the touch inorganic layer.

It is to be understood that both the foregoing general description and the following detailed description of the present disclosure are exemplary and explanatory and are intended to provide further explanation of the disclosure as claimed.

BRIEF DESCRIPTION OF THE SEVERAL VIEWS OF THE DRAWINGS

The accompanying drawings, which are included to provide a further understanding of the disclosure and are incorporated in and constitute a part of this application, illustrate embodiments of the disclosure and together with the description serve to explain the principle of the disclosure. In the drawings.

DETAILED DESCRIPTION

Figure 1:
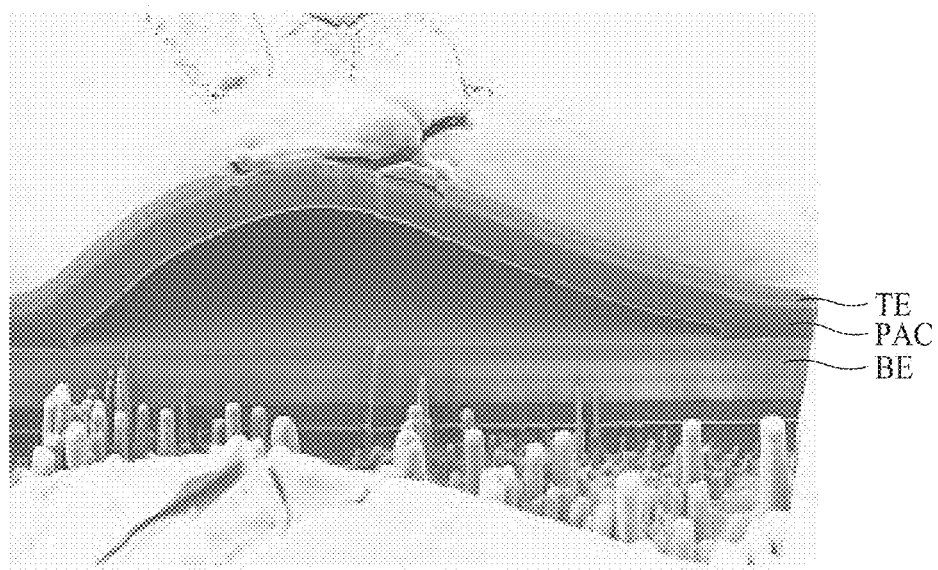
FIG. 1 is an exemplary diagram illustrating the partial detachment of an organic layer from a bridge electrode.

Reference will now be made in detail to the exemplary embodiments of the present disclosure, examples of which are illustrated in the accompanying drawings. Wherever possible, the same reference numbers will be used throughout the drawings to refer to the same or like parts.

In the specification, it should be noted that like reference numerals already used to denote like elements in other drawings are used for elements wherever possible. In the following description, when a function and a configuration known to those skilled in the art are irrelevant to the essential configuration of the present disclosure, their detailed descriptions will be omitted. The terms described in the specification should be understood as follows.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~,' 'over~,' 'under~,' and 'next~,' one or more other parts may be disposed between the two parts unless exclusively limited by terms such as 'just' or 'direct'.

In describing a time relationship, for example, when the temporal order is described as 'after~,' 'subsequent~,' 'next~,' and 'before~,' a case which is not continuous may be included unless 'just' or 'direct' is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

An X axis direction, a Y axis direction, and a Z axis direction should not be construed as only a geometric relationship where a relationship therebetween is vertical, and may denote having a broader directionality within a scope where elements of the present disclosure operate functionally.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, exemplary embodiments of the present disclosure will be described in detail with reference to the accompanying drawings.

Figure 2:
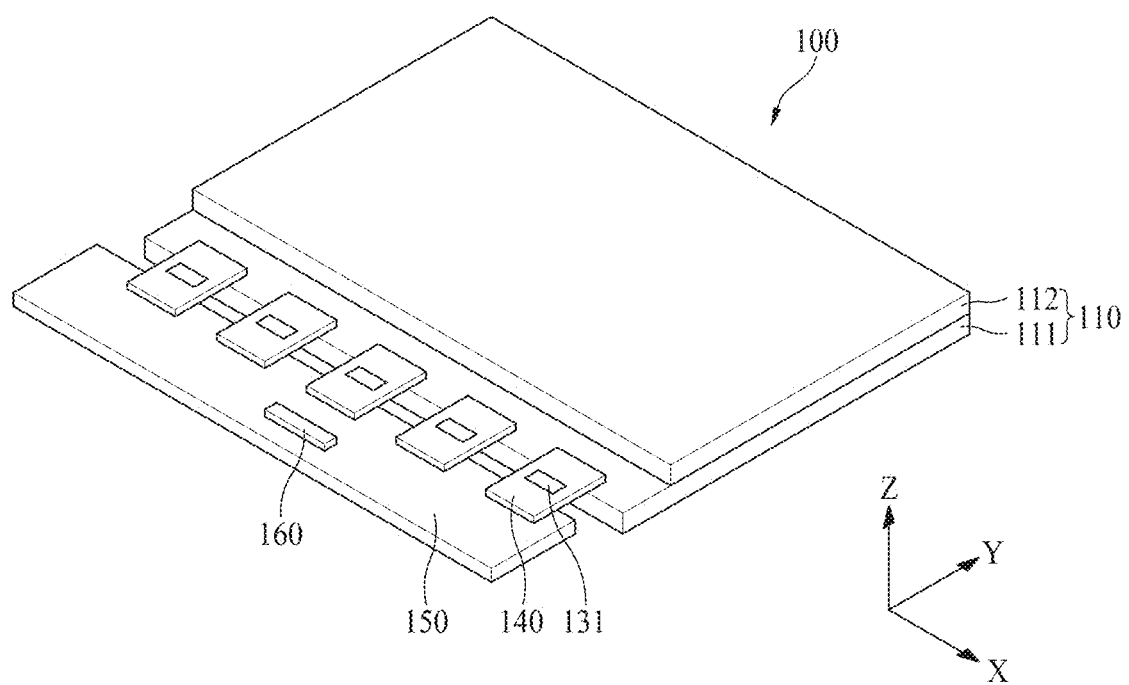
FIG. 2 is a perspective view illustrating a display device with integrated touch screen according to an embodiment of the present disclosure.
Figure 3:
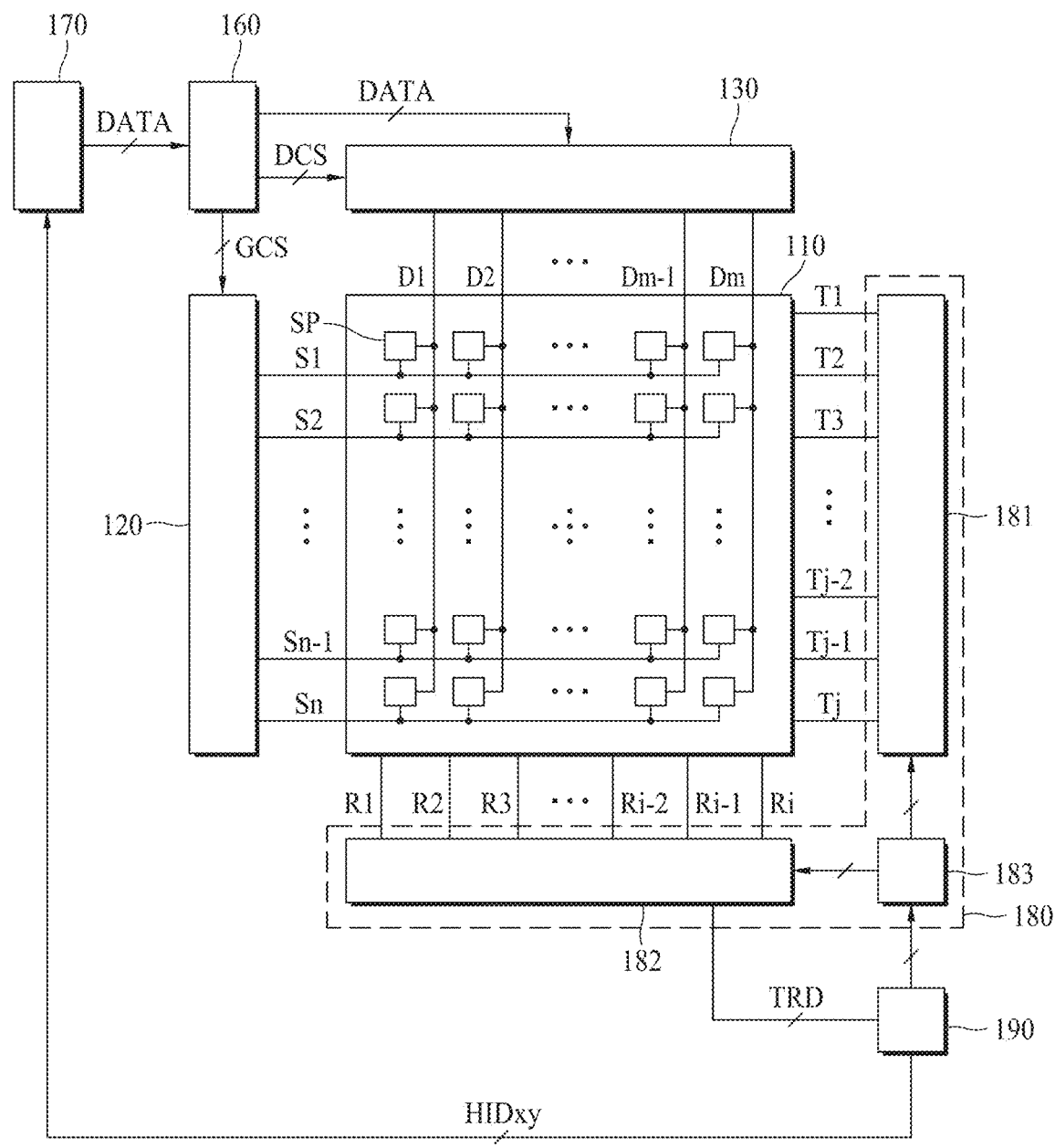
FIG. 3 is a block diagram illustrating a display device with integrated touch screen according to an embodiment of the present disclosure.

FIG. 2 is a perspective view illustrating a display device with integrated touch screen according to an embodiment of the present disclosure. FIG. 3 is a block diagram illustrating a display device with integrated touch screen according to an embodiment of the present disclosure.

Referring to FIGS. 2 and 3, the display device with integrated touch screen according to an embodiment of the present disclosure may include a display panel 110, a scan driver 120, a data driver 130, a timing controller 160, a host system 170, a touch driver 180, and a touch coordinate calculator 190.

The display device with integrated touch screen according to an embodiment of the present disclosure may be implemented with an LCD device, a field emission display (FED) device, a PDP device, an organic light emitting display device, an electrophoresis display (EPD) device, or the like. Hereinafter, an example where the display device with integrated touch screen according to an embodiment of the present disclosure is implemented with an organic light emitting display device will be described, but the present disclosure is not limited thereto.

The display panel 110 may include a first substrate 111 and a second substrate 112. The second substrate 112 may be an encapsulation substrate. The first substrate 111 may be a plastic film, a glass substrate, or the like. The second substrate 112 may be a plastic film, a glass substrate, an encapsulation film (a protective film), or the like.

The display panel 110 may include a display area where a plurality of subpixels SP are provided to display an image. A plurality of data lines D1 to Dm (where m is a positive integer equal to or more than two) and a plurality of scan lines S1 to Sn (where n is a positive integer equal to or more than two) may be provided. The data lines D1 to Dm may be provided to intersect the scan lines S1 to Sn. The subpixels SP may be respectively provided in a plurality of areas defined by an intersection structure of the data lines D1 to Dm and the scan lines S1 to Sn.

Each of the subpixels SP of the display panel 110 may be connected to one of the data lines D1 to Dm and one of the scan lines S1 to Sn. Each of the subpixels SP of the display panel 110 may include a driving transistor which controls a drain-source current according to a data voltage applied to a gate electrode, a scan transistor which is turned on by a scan signal of a scan line and supplies the data voltage of a data line to the gate electrode of the driving transistor, an organic light emitting diode (OLED) which emits light with the drain-source current of the driving transistor, and a capacitor which stores a voltage at the gate electrode of the driving transistor. Therefore, each of the subpixels SP may emit light with a current supplied to the OLED.

The scan driver 120 may receive a scan control signal GCS from the timing controller 160. The scan driver 120 may supply scan signals to the scan lines S1 to Sn according to the scan control signal GCS.

The scan driver 120 may be provided in a non-display area outside one side or both sides of a display area of the display panel 110 in a gate driver-in panel (GIP) type. Alternatively, the scan driver 120 may be manufactured as a driving chip and may be mounted on a flexible film, and moreover, may be attached on the non-display area outside the one side or the both sides of the display area of the display panel 110 in a tape automated bonding (TAB) type.

The data driver 130 may receive digital video data DATA and a data control signal DCS from the timing controller 160. The data driver 130 may convert the digital video data DATA into analog positive/negative data voltages according to the data control signal DCS and may supply the data voltages to the data lines. That is, subpixels to which the data voltages are to be supplied may be selected by the scan signals of the scan driver 120, and the data voltages may be supplied to the selected subpixels.

The data driver 130, as in FIG. 2, may include a plurality of source drive integrated circuits (ICs) 131. Each of the plurality of source drive ICs 131 may be mounted on a flexible film 140 in a chip-on film (COF) type or a chip-on plastic (COP) type. The flexible film 140 may be attached on a plurality of pads provided in the non-display area of the display panel 110 by using an anisotropic conductive film, and thus, the plurality of source drive ICs 131 may be connected to the pads.

The flexible film 140 may be provided in plurality, and a circuit board 150 may be attached on the flexible films 140. A plurality of circuits respectively implemented as driving chips may be mounted on the circuit board 150. For example, the timing controller 160 may be mounted on the circuit board 150. The circuit board 150 may be a printed circuit board (PCB) or a flexible printed circuit board (FPCB).

The timing controller 160 may receive the digital video data DATA and timing signals from the host system 170. The timing signals may include a vertical synchronization signal, a horizontal synchronization signal, a data enable signal, a dot clock, etc. The vertical synchronization signal may be a signal that defines one frame period. The horizontal synchronization signal may be a signal that defines one horizontal period necessary for supplying data voltages to subpixels of one horizontal line of the display panel 110. The data enable signal may be a signal that defines a period where valid data is input. The dot clock may be a signal that is repeated at a certain short period.

The timing controller 160 may generate the data control signal DCS for controlling an operation timing of the data driver 130 and the scan control signal GCS for controlling an operation timing of the scan driver 120 so as to control the operation timing of each of the scan driver 120 and the data driver 130, based on the timing signals. The timing controller 160 may output the scan control signal GCS to the scan driver 120 and may output the digital video data DATA and the data control signal DCS to the data driver 130.

The host system 170 may be implemented as a navigation system, a set-top box, a DVD player, a blue-ray player, a personal computer (PC), a home theater system, a broadcasting receiver, a phone system, or the like. The host system 170 may include a system-on chip (SoC) with a scaler embedded therein and may convert the digital video data DATA of an input image into a format suitable for displaying the image on the display panel 110. The host system 170 may transmit the digital video data DATA and the timing signals to the timing controller 160.

In addition to the data lines D1 to Dm and the scan lines Si to Sn, a plurality of first and second touch electrodes may be provided in the display panel 110. The first touch electrodes may be provided to intersect the second touch electrodes. The first touch electrodes may be connected to a first touch driver 181 through a plurality of first touch lines T1 to Tj (where j is a positive integer equal to or more than two). The second touch electrodes may be connected to a second touch driver 182 through a plurality of second touch lines R1 to Ri (where i is a positive integer equal to or more than two). A plurality of touch sensors may be respectively provided in intersection portions of the first touch electrodes and the second touch electrodes. In an embodiment of the present disclosure, each of the touch sensors may be exemplarily implemented with a mutual capacitor, but is not limited thereto. A disposition structure of the first and second touch electrodes will be described below in detail with reference to FIG. 5.

The touch driver 180 may supply a driving pulse to the first touch electrodes through the first touch line T1 to Tj and may sense charging variations of the touch sensors through the second touch lines R1 to Ri. That is, in FIG. 3, it is described that the first touch line T1 to Tj are Tx lines through which the driving pulse is supplied, and the second touch lines R1 to Ri are Rx lines through which the charging variations of the touch sensors are respectively sensed.

The touch driver 180 may include a first touch driver 181, a second touch driver 182, and a touch controller 183. The first touch driver 181, the second touch driver 182, and the touch controller 183 may be integrated into one readout integrated chip (ROIC).

The first touch driver 181 may select a first touch line through which the driving pulse is to be output, based on control by the touch controller 183 and may supply the driving pulse to the selected first touch line. For example, the driving pulse may be provided in plurality, and the first touch driver 181 may sequentially supply the driving pulses to the first touch lines T1 to Tj.

The second touch driver 182 may select second touch lines through which charging variations of touch sensors are to be received, based on control by the touch controller 183 and may receive the charging variations of the touch sensors through the selected second touch lines. The second touch driver 182 may sample the charging variations of the touch sensors received through the second touch lines R1 to Ri to convert the charging variations into touch raw data TRD which are digital data.

The touch controller 183 may generate a Tx setup signal for setting a first touch line, to which the driving pulse is to be output from the first touch driver 181, and an Rx setup signal for setting a second touch line through which a touch sensor voltage is to be received by the second touch driver 182. Also, the touch controller 183 may generate timing control signals for controlling the operation timings of the first touch driver 181 and the second touch driver 182.

The touch coordinate calculator 190 may receive the touch raw data TRD from the touch driver 180. The touch coordinate calculator 190 may calculate touch coordinates, based on a touch coordinate calculation method and may output touch coordinate data HIDxy, including information about the touch coordinates, to the host system 170.

The touch coordinate calculator 190 may be implemented with a micro controller unit (MCU). The host system 170 may analyze the touch coordinate data HIDxy input from the touch coordinate calculator 190 to execute an application program associated with coordinates where a touch has been performed by a user. The host system 170 may transmit the digital video data DATA and the timing signals to the timing controller 160 according to the executed application program.

The touch driver 180 may be included in the source drive ICs 131, or may be manufactured as a separate driving chip and mounted on the circuit board 150. Also, the touch coordinate calculator 190 may be manufactured as a separate driving chip and mounted on the circuit board 150.

Figure 4:
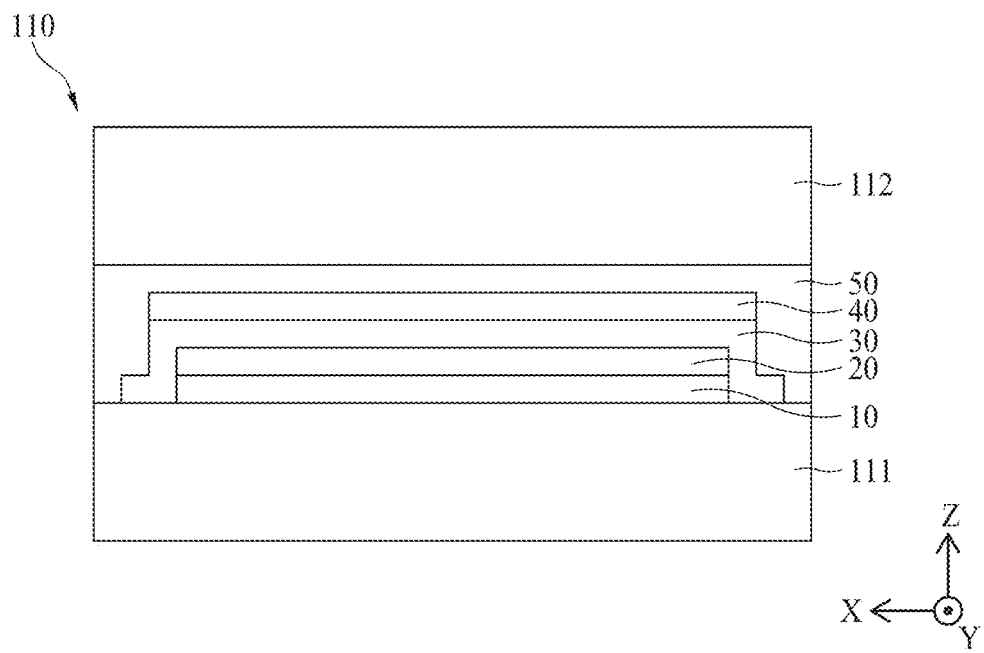
FIG. 4 is a cross-sectional view of one side of a display panel of FIG. 2.

FIG. 4 is a cross-sectional view of one side of a display panel of FIG. 2.

Referring to FIG. 4, the display panel 110 may include a first substrate 111, a second substrate 112, a thin film transistor (TFT) layer 10 disposed between the first and second substrates 111 and 112, a light emitting device layer 20, an encapsulation layer 30, a touch sensing layer 40, and an adhesive layer 50.

The first substrate 111 may be a plastic film, a glass substrate, or the like.

The TFT layer 10 may be formed on the first substrate 111. The TFT layer 10 may include the scan lines, the data lines, and a plurality of TFTs. The TFTs may each include a gate electrode, a semiconductor layer, a source electrode, and a drain electrode. In a case where the scan driver is provided as the GIP type, the scan driver may be formed along with the TFT layers 10. The TFT layer 10 will be described below in detail with reference to FIGS. 7 to 9.

The light emitting device layer 20 may be formed on the TFT layer 10. The light emitting device layer 20 may include a plurality of first electrodes, a light emitting layer, a second electrode, and a plurality of banks. The light emitting layer may include an organic light emitting layer including an organic material. In this case, the light emitting layer may include a hole transporting layer, an organic light emitting layer, and an electron transporting layer. When a voltage is applied to the first electrode and the second electrode, a hole and an electron move to the organic light emitting layer through the hole transporting layer and the electron transporting layer and are combined with each other in the organic light emitting layer to emit light. The light emitting device layer 20 may be a pixel array layer where pixels are provided, and thus, an area where the light emitting device layer 20 is provided may be defined as a display area. A peripheral area of the display area may be defined as a non-display area. The light emitting device layer 20 will be described below in detail with reference to FIGS. 7 to 9.

The encapsulation layer 30 may be formed on the light emitting device layer 20. The encapsulation layer 30 prevents oxygen or water from penetrating into the light emitting device layer 20. The encapsulation layer 30 may include at least one inorganic layer and at least one organic layer. A cross-sectional structure of the encapsulation layer 30 will be described below in detail with reference to FIGS. 7 to 9.

The touch sensing layer 40 may be formed on the encapsulation layer 30. The touch sensing layer 40 may include first and second touch electrode layers for sensing a user touch. The first touch electrode layer may include a plurality of first touch electrodes connected to the first touch lines T1 to Tj and a plurality of second touch electrodes connected to the second touch lines R1 to Ri. The second touch electrode layer may include a plurality of bridge electrodes which connect the first touch electrodes or the second touch electrodes. In an embodiment of the present disclosure, since the touch sensing layer 40 for sensing a user touch is formed on the encapsulation layer 30, it is not required that a touch screen device is separately attached on a display device. A plane structure of the touch sensing layer 40 will be described below with reference to FIGS. 5 and 6. Also, a cross-sectional structure of the touch sensing layer 40 will be described below in detail with reference to FIGS. 7 to 9.

The adhesive layer 50 may be formed on the touch sensing layer 40. The adhesive layer 50 may attach the second substrate 112 on the first substrate 111 on which the TFT layer 10, the light emitting device layer 20, the encapsulation layer 30, and the touch sensing layer 40 are provided. The adhesive layer 50 may be an optically clear resin (OCR) layer, an optically clear adhesive (OCA) film, or the like.

The second substrate 112 may act as a cover substrate or a cover window, which covers the first substrate 111. The second substrate 112 may be a plastic film, a glass substrate, an encapsulation film (a protective film), or the like.

Figure 5:
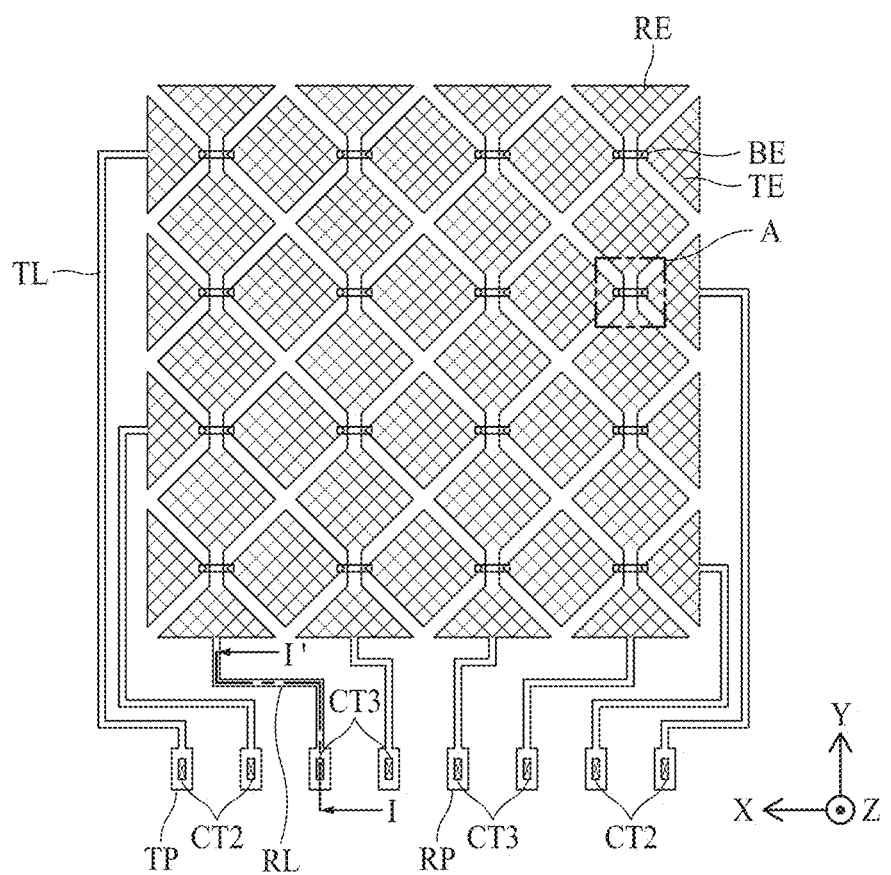
FIG. 5 is a plan view illustrating first and second touch electrodes, bridge electrodes, and first and second touch lines of a display device with integrated touch screen according to an embodiment of the present disclosure.

FIG. 5 is a plan view illustrating first and second touch electrodes, bridge electrodes, and first and second touch lines of a display device with integrated touch screen according to an embodiment of the present disclosure.

Referring to FIG. 5, a plurality of first touch electrodes TE may be arranged in a first direction (an X-axis direction), and a plurality of second touch electrodes RE may be arranged in a second direction (a Y-axis direction) intersecting the first direction (the X-axis direction). The first direction (the X-axis direction) may be a direction parallel to the scan lines S1 to Sn, and the second direction (the Y-axis direction) may be a direction parallel to the data lines D1 to Dm. Alternatively, the first direction (the X-axis direction) may be a direction parallel to the data lines D1 to Dm, and the second direction (the Y-axis direction) may be a direction parallel to the scan lines S1 to Sn. In FIG. 5, an example where the first touch electrodes TE and the second touch electrodes RE have a diamond-shaped plane structure is illustrated, but the present embodiment is not limited thereto.

In order to prevent the first touch electrodes TE and the second touch electrodes RE from being short-circuited in intersection areas therebetween, the first touch electrodes TE which are adjacent to each other in the first direction (the X-axis direction) may be electrically connected to one another through a plurality of bridge electrodes BE. A mutual capacitance corresponding to a touch sensor may be generated in an intersection area of each of the first touch electrodes TE and a corresponding second touch electrode RE.

Moreover, each of first touch electrodes TE connected to each other in the first direction (the X-axis direction) may be spaced apart from and electrically insulated from first touch electrodes TE adjacent thereto in the second direction (the Y-axis direction). Each of second touch electrodes RE connected to each other in the second direction (the Y-axis direction) may be spaced apart from and electrically insulated from second touch electrodes RE adjacent thereto in the first direction (the X-axis direction).

A first touch electrode TE, disposed in one side end among first touch electrodes TE connected to each other in the first direction (the X-axis direction), may be connected to a first touch line TL. The first touch line TL may be connected to the first touch driver 181 through a first touch pad TP. Therefore, the first touch electrodes TE connected to each other in the first direction (the X-axis direction) may receive a touch driving signal from the first touch driver 181 through the first touch line TL.

A second touch electrode RE, disposed in one side end among second touch electrodes RE connected to each other in the second direction (the Y-axis direction), may be connected to a second touch line RL. The second touch line RL may be connected to the second touch driver 182 through a second touch pad RP. Therefore, the second touch driver 182 may receive charging variations of touch sensors of the second touch electrodes RE connected to each other in the second direction (the Y-axis direction).

Figure 6:
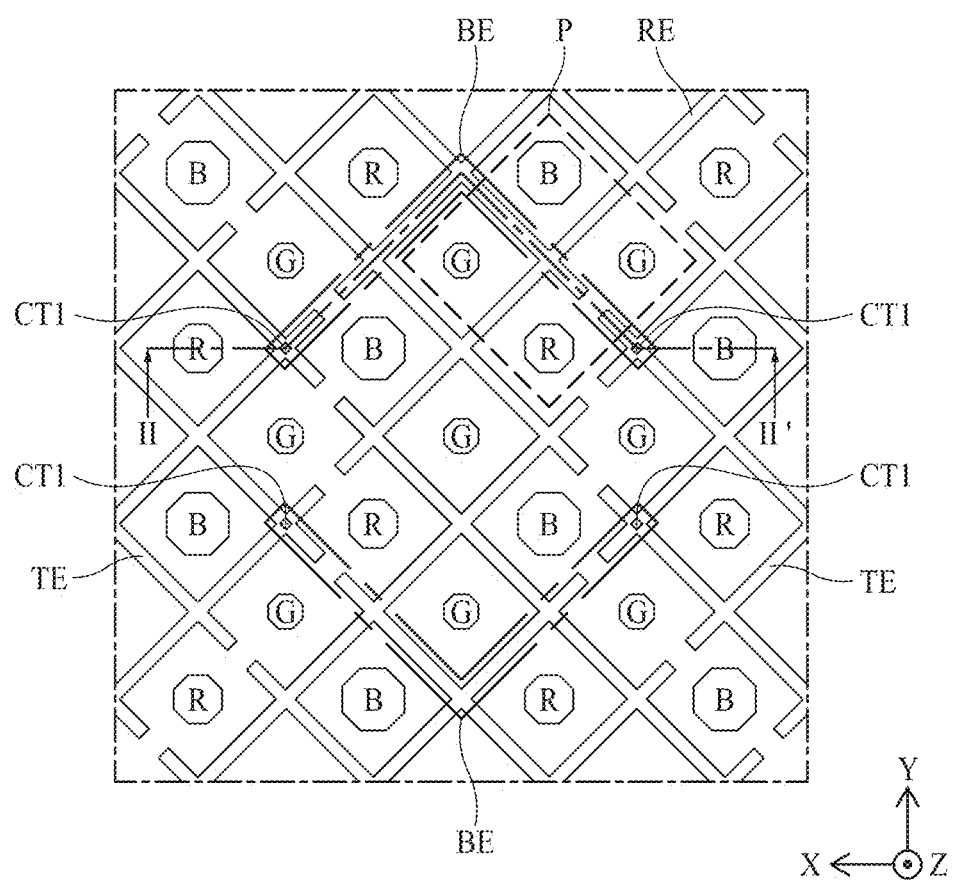
FIG. 6 is an enlarged view illustrating in detail an example of a region A of FIG. 5, in accordance with one or more embodiments of the present disclosure.

FIG. 6 is an enlarged view illustrating in detail an example of a region A of FIG. 5.

Referring to FIG. 6, a plurality of pixels P may be provided in a pentile structure. Each of the pixels P may include a plurality of subpixels SP, and for example, as in FIG. 6, may include one red subpixel R, two green subpixels G, and one subblue pixel B. The red subpixel R, the green subpixels G, and the blue subpixel B may be provided as an octagonally planar type. Also, a size of the blue subpixel B may be largest, and a size of each of the green subpixels G may be smallest. In FIG. 6, an example where the pixels P are provided in the pentile structure is illustrated, but the present embodiment is not limited thereto.

The first touch electrodes TE and the second touch electrodes RE may be provided in a mesh structure so as not to overlap the red pixel R, the green pixels G, and the blue pixel B of the pixels P. That is, the first touch electrodes TE and the second touch electrodes RE may be provided on a bank which is provided between the red pixel R, the green pixels G, and the blue pixel B.

First touch electrodes TE which are adjacent to each other in the first direction (the X-axis direction) may be electrically connected to each other through a plurality of bridge electrodes BE. The bridge electrodes BE may be respectively connected to first touch electrodes TE adjacent to each other through first contact holes CT1 exposing the first touch electrodes TE. Each of the bridge electrodes BE may overlap a corresponding first touch electrode TE and a corresponding second touch electrode RE. Each of the bridge electrodes BE may be provided on the bank which is provided between the red pixel R, the green pixels G, and the blue pixel B.

The bridge electrodes BE may have a bar structure like "-" as well as a bended structure like "∧," "∨," "<" or ">" as shown in FIG. 6, but the embodiments of the present disclosure are not limited thereto. The bridge electrodes BE are not overlapped with the red pixel R, the green pixels G, and the blue pixel B of the pixel P. Therefore, if the bridge electrodes BE have the bended structure, the bridge electrodes BE are overlapped with a left first touch electrode TE, a second touch electrode RE, and a right first touch electrode TE as shown in FIG. 6. Also, The bridge electrodes BE are formed as a mesh type.

The first and second touch electrodes TE and RE may be disposed on the same layer, and the bridge electrodes BE may be disposed on a layer which differs from a layer on which the first and second touch electrodes TE and RE are disposed.

Figure 7:
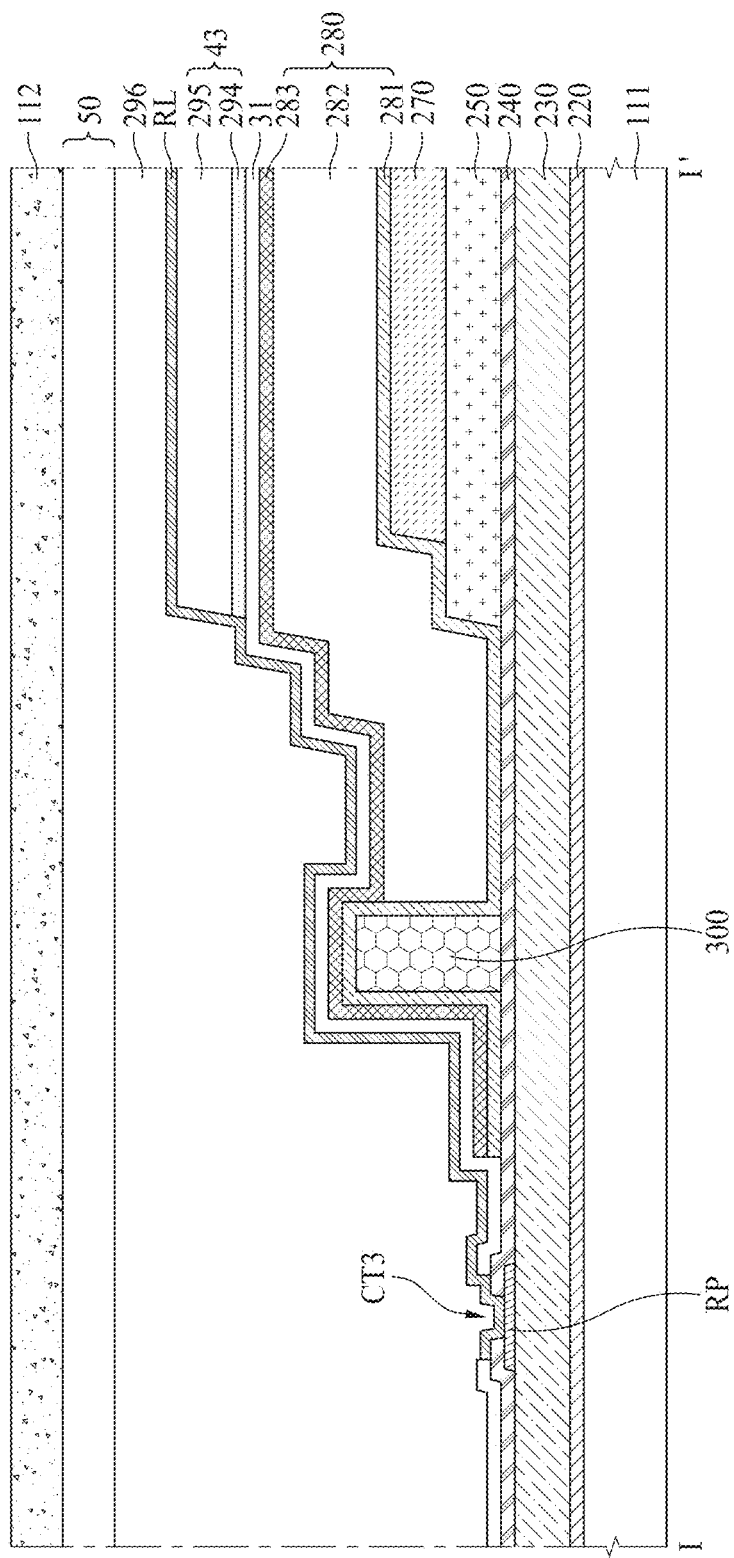
FIG. 7 is a cross-sectional view illustrating an example taken along line I-I' of FIG. 5.
Figure 8:
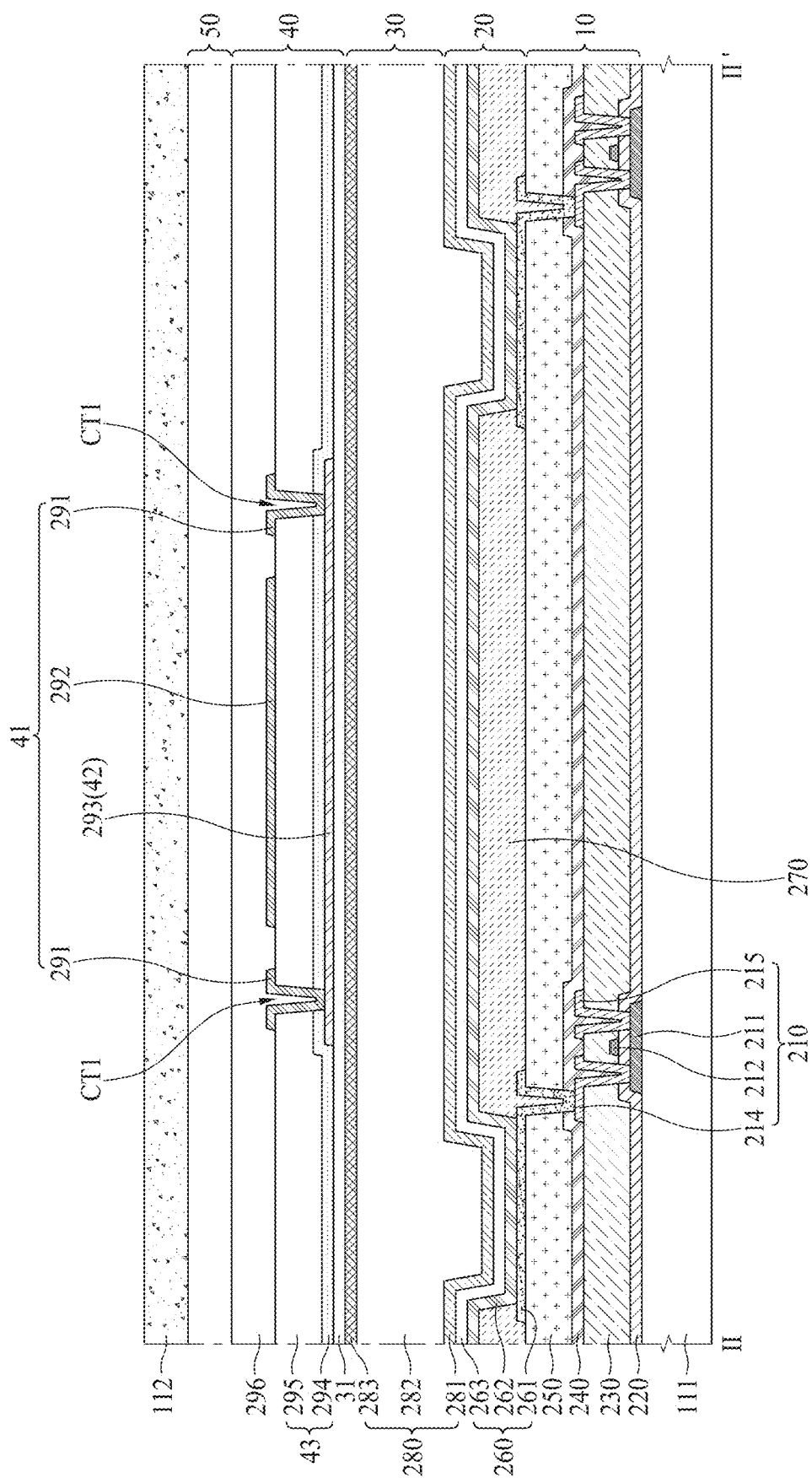
FIG. 8 is a cross-sectional view illustrating an example taken along line II-II' of FIG. 6.

FIG. 7 is a cross-sectional view illustrating an example taken along line I-I' of FIG. 5. FIG. 8 is a cross-sectional view illustrating an example taken along line II-II' of FIG. 6.

In FIG. 7, a connection structure of the second touch line RL and the second touch pad RP is illustrated in detail. In FIG. 8, a connection structure of the bridge electrode BE and the first touch electrodes TE is illustrated in detail.

Referring to FIGS. 7 and 8, a TFT layer 10 may be formed on a first substrate 111. The TFT layer 10 may include a plurality of TFTs 210, first and second touch pads TP and RP, a gate insulation layer 220, an interlayer insulation layer 230, a passivation layer 240, and a planarization layer 250.

A first buffer layer may be formed on one surface of the first substrate 111. The first buffer layer may be formed on the one surface of the first substrate 111, for protecting the TFTs 210 and a plurality of organic light emitting devices 260 from water penetrating through the first substrate 111 vulnerable to penetration of water. The one surface of the first substrate 111 may be a surface facing the second substrate 112. The first buffer layer may be formed of a plurality of inorganic layers which are alternately stacked. For example, the first buffer layer may be formed of a multilayer where one or more inorganic layers of silicon oxide (SiOx), silicon nitride (SiNx), and SiON are alternately stacked. The first buffer layer may be omitted.

The TFTs 210 may be formed on the first buffer layer. The TFTs 210 may each include an active layer 211, a gate electrode 212, a source electrode 214, and a drain electrode 215. In FIG. 8, the TFTs 210 are exemplarily illustrated as being formed as a top gate type where the gate electrode 212 is disposed on the active layer 211, but is not limited thereto. That is, the TFTs 210 may be formed as a bottom gate type where the gate electrode 212 is disposed under the active layer 211 or a double gate type where the gate electrode 212 is disposed both on and under the active layer 211.

The active layer 211 may be formed on the first buffer layer. The active layer 211 may be formed of a silicon-based semiconductor material, an oxide-based semiconductor material, and/or the like. A light blocking layer (not shown) for blocking external light incident on the active layer 211 may be formed between the first buffer layer and the active layer 211.

The gate insulation layer 220 may be formed on the active layer 211. The gate insulation layer 220 may be formed of an inorganic layer, and for example, may be formed of SiOx, SiNx, or a multilayer thereof.

The gate electrode 212 and a gate line may be formed on the gate insulation layer 220. The gate electrode 212 and the gate line may each be formed of a single layer or a multilayer which includes one of molybdenum (Mo), aluminum (Al), chromium (Cr), gold (Au), titanium (Ti), nickel (Ni), neodymium (Nd), and copper (Cu), or an alloy thereof.

The interlayer insulation layer 230 may be formed on the gate electrode 212 and the gate line. The interlayer insulation layer 230 may be formed of an inorganic layer, and for example, may be formed of SiOx, SiNx, or a multilayer thereof.

The source electrode 214, the drain electrode 215, a data line, and first and second touch pads TP and RP may be formed on the interlayer insulation layer 230. Each of the source electrode 214 and the drain electrode 215 may be connected to the active layer 211 through a contact hole which passes through the gate insulation layer 220 and the interlayer insulation layer 230. The source electrode 214, the drain electrode 215, the data line, and the first and second touch pads TP and RP may each be formed of a single layer or a multilayer which includes one of Mo, Al, Cr, Au, Ti, Ni, Nd, and Cu, or an alloy thereof.

The passivation layer 240 for insulating the TFTs 220 may be formed on the source electrode 214, the drain electrode 215, the data line, and the first and second touch pads TP and RP. The passivation layer 240 may be formed of an inorganic layer, and for example, may be formed of SiOx, SiNx, or a multilayer thereof.

The planarization layer 250 for planarizing a step height caused by the TFTs 210 may be formed on the passivation layer 240. The planarization layer 250 may be formed of an organic layer such as acryl resin, epoxy resin, phenolic resin, polyamide resin, polyimide resin, or the like.

The light emitting device layer 20 may be formed on the TFT layer 10. The light emitting device layer 20 may include a plurality of light emitting devices and a bank 270.

The light emitting devices and the bank 270 may be formed on the planarization layer 250. The light emitting devices may each include a first electrode 261, an organic light emitting layer 262, and a second electrode 263. The first electrode 261 may be an anode electrode, and the second electrode 263 may be a cathode electrode.

The first electrode 261 may be formed on the planarization layer 250. The first electrode 261 may be connected to the source electrode 214 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO. The APC alloy may be an alloy of Ag, palladium (Pd), and Cu.

The bank 270 may be formed on the planarization layer 250 to divide the first electrode 261, for acting as a pixel defining layer which defines a plurality of subpixels SP. The bank 270 may be formed to cover an edge of the first electrode 261.

Each of the subpixels SP may denote an area where the first electrode 261 corresponding to an anode electrode, the light emitting layer 262, and the second electrode 263 corresponding to a cathode electrode are sequentially stacked, and a hole from the first electrode 261 and an electron from the second electrode 263 are combined with each other in the light emitting layer 262 to emit light.

The light emitting layer 262 may be formed on the first electrode 261 and the bank 270. The light emitting layer 262 may be an organic light emitting layer which includes an organic material and emits light having a certain color. In a case where the light emitting layer 262 is a white light emitting layer emitting white light, the light emitting layer 262 may be a common layer which is formed in the pixels P in common. In this case, the light emitting layer 262 may be formed in a tandem structure including two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer where alkali metal, such as lithium (Li), sodium (Na), potassium (K), or cesium (Cs), or alkali earth metal such as magnesium (Mg), strontium (Sr), barium (Ba), or radium (Ra) is doped on an organic host material having an ability to transport electrons. The p-type charge generating layer may be an organic layer where a dopant is doped on an organic material having an ability to transport holes.

The second electrode 263 may be formed on the light emitting layer 262. The second electrode 263 may be formed to cover the light emitting layer 262. The second electrode 263 may be a common layer which is formed in the plurality of pixels P in common.

The second electrode 263 may be formed of a transparent conductive material (or TCO), such as indium tin oxide (ITO) or indium zinc oxide (IZO) capable of transmitting light, or a semi-transmissive conductive material such as Mg, Ag, or an alloy of Mg and Ag. If the second electrode 263 is formed of a semi-transmissive conductive material, emission efficiency is enhanced by a micro-cavity. A capping layer may be formed on the second electrode 263.

The encapsulation layer 30 may be formed on the light emitting device layer 260. The encapsulation layer 30 may include an encapsulation film 280.

The encapsulation film 280 may be formed on the second electrode 263. The encapsulation film 280 may include at least one inorganic layer and at least one organic layer, for preventing oxygen or water from penetrating into the light emitting layer 262 and the second electrode 263. For example, as in FIGS. 7 and 8, the encapsulation film 280 may include first and second inorganic layers 281 and 283 and an organic layer 282 disposed between the first and second inorganic layers 281 and 283. Each of the first and second inorganic layers 281 and 283 may be formed of silicon nitride, aluminum nitride, zirconium nitride, titanium nitride, hafnium nitride, tantalum nitride, silicon oxide, aluminum oxide, titanium oxide, and/or the like. The organic layer 282 may be formed to have a sufficient thickness (for example, a thickness of about 7 μm to 8 μm), for preventing particles from penetrating into the light emitting layer 262 and the second electrode 263 via the encapsulation film 280.

A flow of the organic layer 282 may be blocked by a dam 300, and thus, the organic layer 282 may be provided more inward than the dam 300. On the other hand, the first and second inorganic layers 281 and 283 may be provided more outward than the dam 300. Also, the first and second inorganic layers 281 and 283 may be provided not to cover the first and second touch pads TP and RP.

A second buffer layer 31 may be formed on the encapsulation layer 30. The second buffer layer 31 may be formed to cover the encapsulation layer 280 and the first and second touch pads TP and RP. The thickness of the second buffer layer 31 may be determined by considering a distance between the bridge electrodes 293 and the second electrode 263. If the distance between the bridge electrodes 293 and the second electrode 263 is more than 5 μm, parasitic capacitances between the bridge electrodes 293 and the second electrode 263 may be reduced. Therefore, the embodiments of the present disclosure may prevent the second electrode 263 from being affected by the coupling between bridge electrodes 293 and the second electrode 263 due to the parasitic capacitances.

The second buffer layer 31 may be formed of an inorganic layer or an organic layer. In a case where the second buffer layer 31 is formed of an inorganic layer, the second buffer layer 31 may be formed of SiOx, SiNx, or a multilayer thereof. In a case where the second buffer layer 31 is formed of an organic layer, a surface roughness of the second buffer layer 31 is roughened by performing plasma treatment on the second buffer layer 31. In this case, an area of the second buffer layer 31 contacting the bridge electrodes 293 of the first touch electrode layer 41 is enlarged, and thus, an interface adhesive force between the second buffer layer 31 and the bridge electrodes 293 of the first touch electrode layer 41 increases.

The touch sensing layer 40 may be formed on the second buffer layer 31. The touch sensing layer 40 may include a first touch electrode layer 41, a second touch electrode layer 42, and a touch insulation layer 43.

The first touch electrode layer 41 may include first and second touch electrodes 291 and 292. That is, the first and second touch electrodes 291 and 292 may be disposed on the same layer. The first and second touch electrodes 291 and 292 may be spaced apart and electrically insulated from each other. The second touch electrode layer 42 may include a plurality of bridge electrodes 293. The touch insulation layer 43 may include a touch inorganic layer 294 and a touch organic layer 295.

In detail, the bridge electrodes 293 may be formed on the second buffer layer 31. The bridge electrodes 293 may each be formed of a single layer or a multilayer which includes one of Mo, Al, Cr, Au, Ti, Ni, Nd, and Cu, or an alloy thereof.

The touch inorganic layer 294 may be formed on the bridge electrodes 293. The touch inorganic layer 294 may be formed of an inorganic layer, and for example, may be formed of SiOx, SiNx, or a multilayer thereof.

The touch organic layer 295 may be formed on the touch inorganic layer 294. An interface adhesive force between the bridge electrodes 293 and the touch inorganic layer 294 is higher than an interface adhesive force between the bridge electrodes 293 and the touch organic layer 295, and thus, if the touch inorganic layer 294 is provided between the bridge electrodes 293 and the touch organic layer 295, the touch organic layer 295 is prevented from being partially detached between the bridge electrodes 293 and the touch organic layer 295.

The organic layer 282 of the encapsulation film 280 may be a particle cover layer for preventing particles from penetrating into the light emitting layer 282 and the second electrode 263 via the encapsulation film 280, but the touch organic layer 295 may be a layer which allows the first touch electrode layer 41 to be spaced apart from the second touch electrode layer 42 by a certain distance. Therefore, the touch organic layer 295 may be formed to have a thickness which is thinner than that of the organic layer 282 of the encapsulation film 280. For example, the touch organic layer 295 may be formed to have a thickness of about 2 μm. Also, a contact hole may not be provided in the organic layer 282 of the encapsulation film 280, and thus, the organic layer 282 of the encapsulation film 280 may not include a photosensitive material. On the other hand, contact holes may be provided in the touch organic layer 295, and thus, the touch organic layer 295 may include a photosensitive material. For example, the touch organic layer 295 may be formed of photo acrylate including a photosensitive material.

The first touch electrodes 291 and the second touch electrodes 292 may be formed on the touch organic layer 295. The first touch electrodes 291, as in FIG. 8, may be connected to the bridge electrodes 293 through first contact holes CT1 which pass through the touch inorganic layer 294 and the touch organic layer 295 and expose the bridge electrodes 293. Therefore, the first touch electrodes 291 may be connected to each other by using the bridge electrodes 293 in intersection areas of the first touch electrodes 291 and the second touch electrodes 292, and thus, the first touch electrodes 291 and the second touch electrodes 292 are not short-circuited with one another. Also, the first touch electrodes 291 and the second touch electrodes 292 may be disposed to overlap the bank 270 so as to prevent an opening area of each subpixel SP from being reduced.

A first touch line TL may extend from the first touch electrode 291, and a second touch line RL may extend from the second touch electrode 292. The first touch line TL may be connected to the first touch pad TP through a second contact hole CT2 which passes through the passivation layer 240 and the second buffer layer 31 and exposes the first touch pad TP. The second touch line RL may be connected to the second touch pad RP through a third contact hole CT3 which passes through the passivation layer 240 and the second buffer layer 31 and exposes the second touch pad RP, as shown in FIG. 7.

The first touch electrodes 291, the second touch electrodes 292, the first touch lines TL, and the second touch lines RL may each be formed of a single layer or a multilayer which includes one of Mo, Al, Cr, Au, Ti, Ni, Nd, and Cu, or an alloy thereof.

An overcoat layer 296 for planarizing a step height caused by the first and second touch electrodes 291 and 292 and the bridge electrodes 293 may be formed on the first and second touch electrodes 291 and 292.

In FIG. 8, an example where the second touch electrode layer 42 is provided on the second buffer layer 31, the touch insulation layer 43 is provided on the second touch electrode layer 42, and the first touch electrode layer 41 is provided on the touch insulation layer 43 is illustrated, but the present embodiment is not limited thereto. In other embodiments, the first touch electrode layer 41 may be provided on the second buffer layer 31, the touch insulation layer 43 may be provided on the first touch electrode layer 41, and the second touch electrode layer 42 may be provided on the touch insulation layer 43.

A color filter layer may be formed on the touch sensing layer 40. The color filter layer may include a plurality of color filters, disposed to overlap subpixels SP, and a black matrix disposed to overlap the bank 270. In a case where the light emitting layer 262 includes a plurality of organic light emitting layers which emit red, green, and blue lights, the color filter layer may be omitted.

The adhesive layer 50 may be formed on the touch sensing layer 40. The adhesive layer 50 may attach the second substrate 112 on the first substrate 111 on which the TFT layer 10, the light emitting device layer 20, the encapsulation layer 30, and the touch sensing layer 40 are provided. The adhesive layer 50 may be an OCR layer, an OCA film, or the like.

The second substrate 112 may act as a cover substrate or a cover window, which covers the first substrate 111. The second substrate 112 may be a plastic film, a glass substrate, an encapsulation film (a protective film), or the like.

As described above, in the present embodiment, the touch inorganic layer 294 may be formed on the bridge electrodes 293 of the second touch electrode layer 42, and then, the touch organic layer 295 may be formed on the touch inorganic layer 294. In the embodiments of the present disclosure, since an interface adhesive force between the bridge electrodes 293 and the touch inorganic layer 294 is higher than an interface adhesive force between the bridge electrodes 293 and the touch organic layer 295, the touch organic layer 295 is prevented from being partially detached between the bridge electrodes 293 and the touch organic layer 295.

Figure 9:
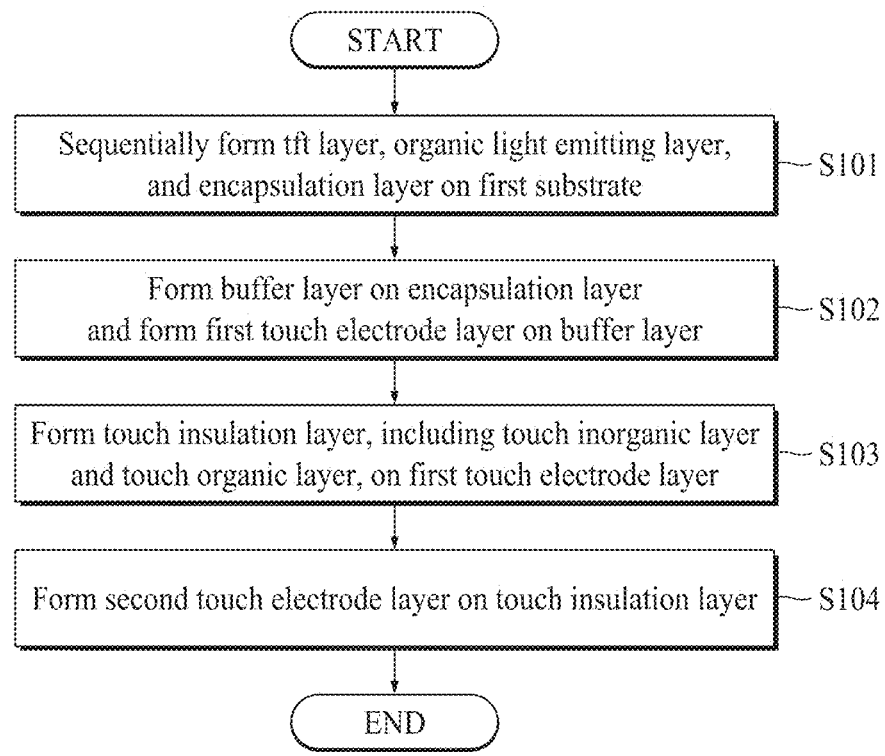
FIG. 9 is a flowchart illustrating a method of manufacturing a display device with integrated touch screen according to an embodiment of the present disclosure.

FIG. 9 is a flowchart illustrating a method of manufacturing a display device with integrated touch screen according to an embodiment of the present disclosure. FIGS. 10A to 10D are cross-sectional views for describing a method of manufacturing a display device with integrated touch screen according to an embodiment of the present disclosure. FIGS. 10A to 10D illustrate the cross-sectional views taken along line II-II' of FIG. 6 illustrated in FIG. 8.

Hereinafter, a method of manufacturing a display device with integrated touch screen according to an embodiment of the present disclosure will be described in detail with reference to FIGS. 9 and FIGS. 10A through 10D.

Figure 10A:
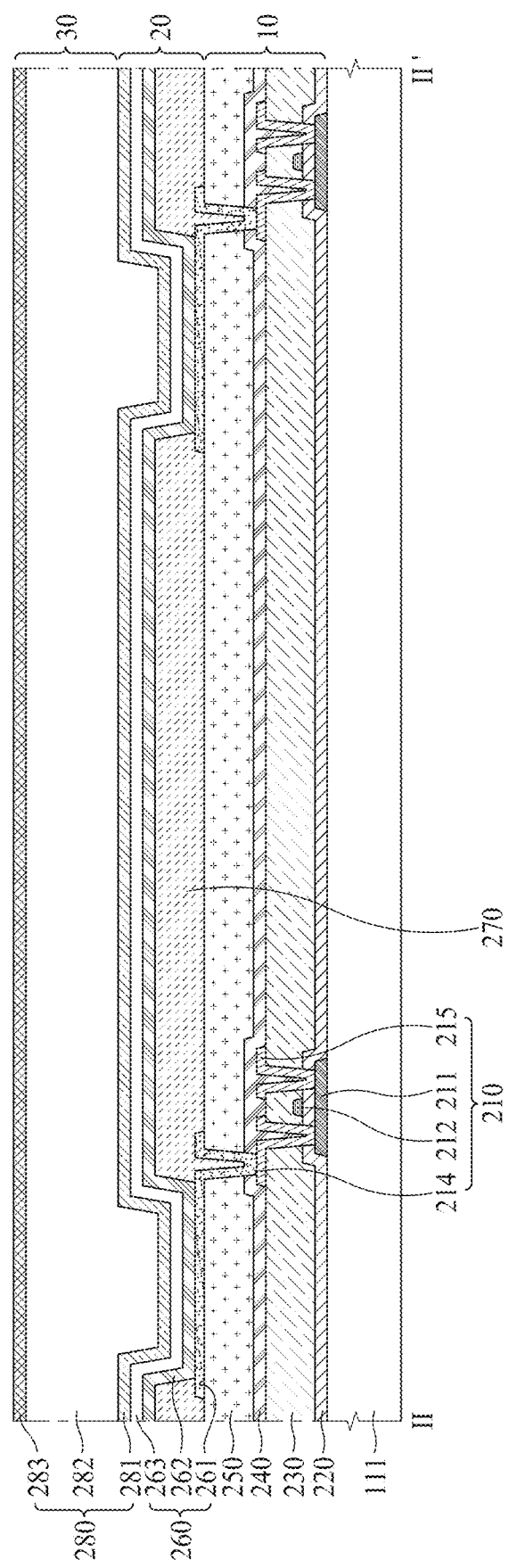
FIGS. 10A, 10B, 10C, and 10D are cross-sectional views for describing a method of manufacturing a display device with integrated touch screen according to an embodiment of the present disclosure.

First, as in FIG. 10A, a TFT layer 10, an organic light emitting device 20, and an encapsulation layer 30 may be formed on a first substrate 111.

In detail, a first buffer layer may be formed on the first substrate 111 before forming a TFT 210. The first buffer layer is for protecting the TFT 210 and an organic light emitting device 260 from water penetrating through the first substrate 111 vulnerable to penetration of water and may be formed of a plurality of inorganic layers which are alternately stacked. For example, the first buffer layer may be formed of a multilayer where one or more inorganic layers of SiOx, SiNx, and SiON are alternately stacked. The first buffer layer may be formed by a chemical vapor deposition (CVD) process.

Subsequently, an active layer 211 of the TFT 210 may be formed on the first buffer layer. In detail, an active metal layer may be formed on a whole surface of the first buffer layer by using a sputtering process, a metal organic chemical vapor deposition (MOCVD) process, and/or the like. Subsequently, the active layer 211 may be formed by patterning the active metal layer through a mask process using a photoresist pattern. The active layer 211 may be formed of a silicon-based semiconductor material or an oxide-based semiconductor material.

Subsequently, a gate insulation layer 220 may be formed on the active layer 211. The gate insulation layer 220 may be formed of an inorganic layer, and for example, may be formed of SiOx, SiNx, or a multilayer thereof.

Subsequently, a gate electrode 212 of the TFT 210 may be formed on the gate insulation layer 220. In detail, a first metal layer may be formed on a whole surface of the gate insulation layer 220 by using a sputtering process, an MOCVD process, and/or the like. Subsequently, the gate electrode 212 may be formed by patterning the first metal layer through a mask process using a photoresist pattern. The gate electrode 212 may be formed of a single layer or a multilayer which includes one of Mo, Al, Cr, Au, Ti, Ni, Nd, and Cu, or an alloy thereof.

Subsequently, an interlayer insulation layer 230 may be formed on the gate electrode 212. The interlayer insulation layer 230 may be formed of an inorganic layer, and for example, may be formed of SiOx, SiNx, or a multilayer thereof.

Subsequently, a plurality of contact holes which pass through the gate insulation layer 220 and the interlayer insulation layer 230 and expose the active layer 211 may be formed.

Subsequently, a source electrode 214 and a drain electrode 215 included in the TFT 210 may be formed on the interlayer insulation layer 230. In detail, a second metal layer may be formed on a whole surface of the interlayer insulation layer 230 by using a sputtering process, an MOCVD process, and/or the like. Subsequently, the source electrode 214 and the drain electrode 215 may be formed by patterning the second metal layer through a mask process using a photoresist pattern. The source electrode 214 and the drain electrode 215 may be connected to the active layer 211 through the contact holes which pass through the gate insulation layer 220 and the interlayer insulation layer 230. The source electrode 214 and the drain electrode 215 may each be formed of a single layer or a multilayer which includes one of Mo, Al, Cr, Au, Ti, Ni, Nd, and Cu, or an alloy thereof.

Subsequently, a passivation layer 240 may be formed on the source electrode 214 and the drain electrode 215 of the TFT 210. The passivation layer 240 may be formed of an inorganic layer, and for example, may be formed of SiOx, SiNx, or a multilayer thereof. The passivation layer 240 may be formed by a CVD process.

Subsequently, a planarization layer 250 for planarizing a step height caused by the TFT 210 may be formed on the passivation layer 240. The planarization layer 250 may be formed of an organic layer such as acryl resin, epoxy resin, phenolic resin, polyamide resin, polyimide resin, and/or the like.

Subsequently, a first electrode 261 included in the organic light emitting device layer 20 may be formed on the planarization layer 250. In detail, a third metal layer may be formed on a whole surface of the planarization layer 250 by using a sputtering process, an MOCVD process, and/or the like. Subsequently, the first electrode 261 may be formed by patterning the third metal layer through a mask process using a photoresist pattern. The first electrode 261 may be connected to the source electrode 214 of the TFT 210 through a contact hole which passes through the passivation layer 240 and the planarization layer 250. The first electrode 261 may be formed of a metal material, which is high in reflectivity, such as a stacked structure (Ti/Al/Ti) of Al and Ti, a stacked structure (ITO/Al/ITO) of Al and ITO, an APC alloy, or a stacked structure (ITO/APC/ITO) of an APC alloy and ITO.

Subsequently, a bank 270 may be formed on the planarization layer 250 to cover an edge of the first electrode 261, for dividing a plurality of subpixels SP. The bank 270 may be formed of an organic layer such as acryl resin, epoxy resin, phenolic resin, polyamide resin, polyimide resin, and/or the like.

Subsequently, a light emitting layer 262 may be formed on the first electrode 261 and the bank 270. The light emitting layer 262 may be an organic light emitting layer. In this case, the organic light emitting layer 262 may be formed on the first electrode 261 and the bank 270 through a deposition process or a solution process. The organic light emitting layer 262 may be a common layer which is formed in pixels P1 to P3 in common. In this case, the organic light emitting layer 262 may be a white light emitting layer which emits white light.

If the organic light emitting layer 262 is the white light emitting layer, the organic light emitting layer 262 may be formed in a tandem structure including two or more stacks. Each of the stacks may include a hole transporting layer, at least one light emitting layer, and an electron transporting layer.

Moreover, a charge generating layer may be formed between the stacks. The charge generating layer may include an n-type charge generating layer, disposed adjacent to a lower stack, and a p-type charge generating layer which is formed on the n-type charge generating layer and is disposed adjacent to an upper stack. The n-type charge generating layer may inject an electron into the lower stack, and the p-type charge generating layer may inject a hole into the upper stack. The n-type charge generating layer may be formed of an organic layer where alkali metal, such as lithium (Li), sodium (Na), potassium (K), or cesium (Cs), or alkali earth metal such as magnesium (Mg), strontium (Sr), barium (Ba), or radium (Ra) is doped on an organic host material having an ability to transport electrons. The p-type charge generating layer may be formed by doping a dopant on an organic material having an ability to transport holes.

Subsequently, a second electrode 263 may be formed on the organic light emitting layer 262. The second electrode 263 may be a common layer which is formed in the pixels P1 to P3 in common. The second electrode 263 may be formed of a transparent conductive material (or TCO) such as ITO or IZO capable of transmitting light. The second electrode 263 may be formed through a physical vapor deposition (PVD) process such as a sputtering process and/or the like. A capping layer may be formed on the second electrode 263.

Subsequently, an encapsulation film 280 may be formed on the second electrode 263. The encapsulation film 280 prevents oxygen or water from penetrating into the organic light emitting layer 262 and the second electrode 263. To this end, the encapsulation film 280 may include at least one inorganic layer. The inorganic layer may be formed of silicon nitride, aluminum nitride, zirconium nitride, titanium nitride, hafnium nitride, tantalum nitride, silicon oxide, aluminum oxide, titanium oxide, and/or the like.

Moreover, the encapsulation film 280 may further include at least one organic layer. The organic layer may be formed to have a sufficient thickness, for preventing particles from penetrating into the organic light emitting layer 262 and the second electrode 263 via the encapsulation film 280.

A process of forming the at least one inorganic layers 281 and 283 and the organic layer 282 of the encapsulation film 280 may be performed as a low temperature process performed at a low temperature of 100° C. or less, for preventing the previously formed organic light emitting layer 262 from being damaged by a high temperature. (S101 of FIG. 9)

Figure 10B:
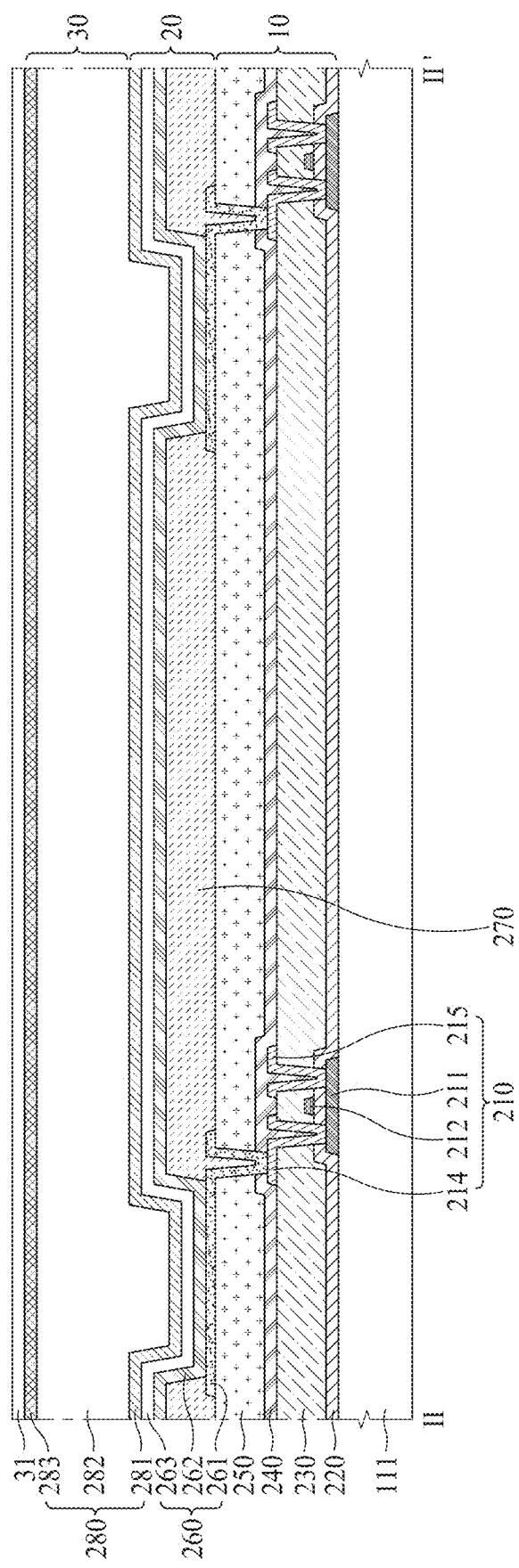

Second, as in FIG. 10B, a second buffer layer 31 may be formed on the encapsulation layer 30. The second buffer layer 31 may be formed to cover the encapsulation layer 280 and the first and second touch pads TP and RP. The second buffer layer 31 may be formed of an inorganic layer or an organic layer. In a case where the second buffer layer 31 is formed of an inorganic layer, the second buffer layer 31 may be formed of SiOx, SiNx, or a multilayer thereof. In a case where the second buffer layer 31 is formed of an organic layer, a surface roughness of the second buffer layer 31 is roughened by performing plasma treatment on the second buffer layer 31. In this case, an area of the second buffer layer 31 contacting the bridge electrodes 293 of the first touch electrode layer 41 is enlarged, and thus, an interface adhesive force between the second buffer layer 31 and the bridge electrodes 293 of the first touch electrode layer 41 increases.

A process of forming the second buffer layer 31 may be performed as a low temperature process performed at a low temperature of 100° C. or less, for preventing the previously formed organic light emitting layer 262 from being damaged by a high temperature.

Second, as in FIG. 10B, a second touch electrode layer 42 including a plurality of bridge electrodes 291 may be formed on the second buffer layer 31. In detail, a fourth metal layer may be formed on a whole surface of the second buffer layer 31 by using a sputtering process, an MOCVD process, and/or the like. Subsequently, the bridge electrodes 291 may be formed by patterning the fourth metal layer through a mask process using a photoresist pattern. The bridge electrodes 291 may be formed in a multi-layer structure including a plurality of electrodes, and for example, may be formed in a three-layer structure of Ti/Al/Ti. (S102 of FIG. 9)

Figure 10C:
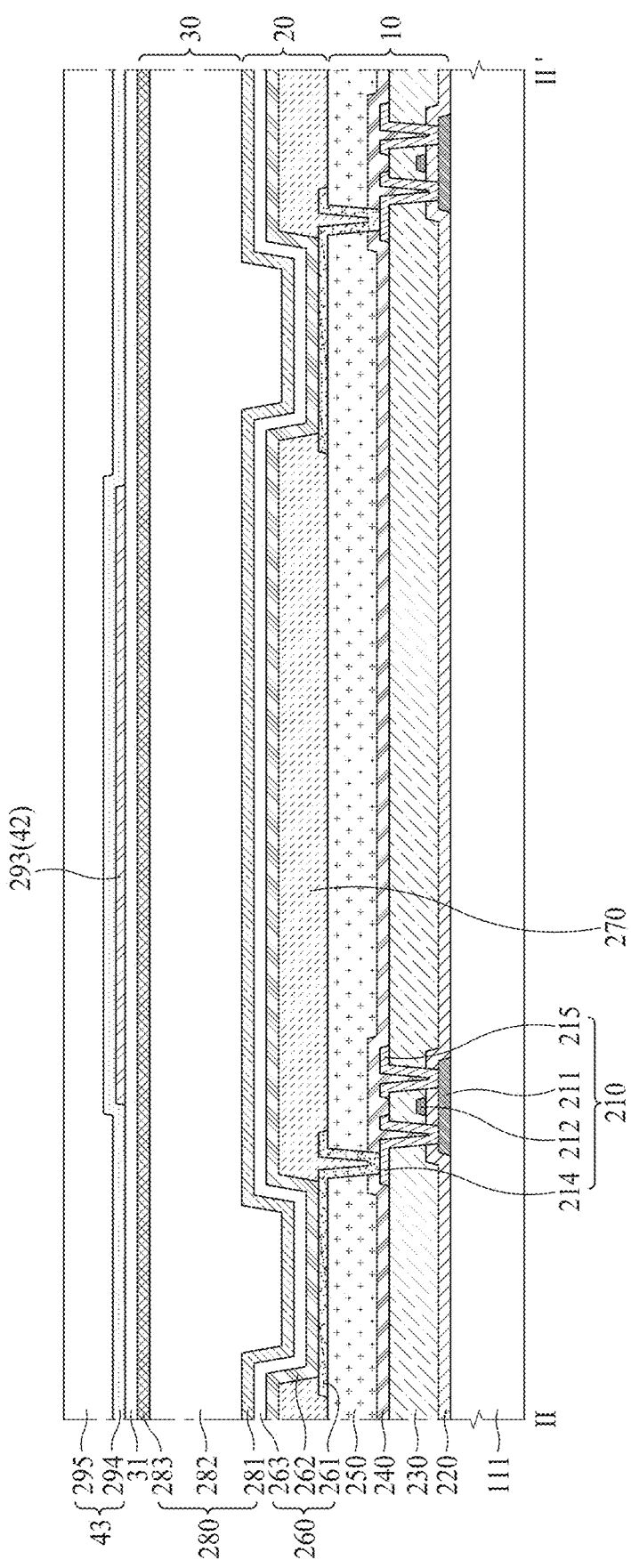

Third, as in FIG. 10C, a touch insulation layer 43 including a touch inorganic layer 294 and a touch organic layer 295 may be formed on the second touch electrode layer 42.

In detail, the touch inorganic layer 294 may be formed on the second touch electrode layer 42. The touch inorganic layer 294 may be formed of SiOx, SiNx, or a multilayer thereof.

Subsequently, the touch organic layer 295 may be formed on the touch inorganic layer 294. An interface adhesive force between the bridge electrodes 293 and the touch inorganic layer 294 is higher than an interface adhesive force between the bridge electrodes 293 and the touch organic layer 295, and thus, if the touch inorganic layer 294 is provided between the bridge electrodes 293 and the touch organic layer 295, the touch organic layer 295 is prevented from being partially detached between the bridge electrodes 293 and the touch organic layer 295.

The organic layer 282 of the encapsulation film 280 may be a particle cover layer for preventing particles from penetrating into the light emitting layer 282 and the second electrode 263 via the encapsulation film 280, but the touch organic layer 295 may be a layer which allows the first touch electrode layer 41 to be spaced apart from the second touch electrode layer 42 by a certain distance. Therefore, the touch organic layer 295 may be formed to have a thickness which is thinner than that of the organic layer 282 of the encapsulation film 280. For example, the touch organic layer 295 may be formed to have a thickness of about 2 μm.

Subsequently, a plurality of first contact holes CT1 which pass through the touch inorganic layer 294 and the touch organic layer 295 and expose the bridge electrodes 293 may be formed. Also, as in FIG. 7, a plurality of second contact holes CT2 which pass through the passivation layer 240 and the second buffer layer 31 and expose the first touch pads TP may be formed, and a plurality of third contact holes CT3 which pass through the passivation layer 240 and the second buffer layer 31 and expose the second touch pads RP may be formed.

A contact hole may not be provided in the organic layer 282 of the encapsulation film 280, and thus, the organic layer 282 of the encapsulation film 280 may not include a photosensitive material. On the other hand, contact holes may be provided in the touch organic layer 295, and thus, the touch organic layer 295 may include a photosensitive material. For example, the touch organic layer 295 may be formed of photo acrylate including a photosensitive material.

A process of forming the touch inorganic layer 294 and the touch organic layer 295 may be performed as a low temperature process performed at a low temperature of 100° C. or less, for preventing the previously formed organic light emitting layer 262 from being damaged by a high temperature. (S103 of FIG. 9)

Figure 10D:
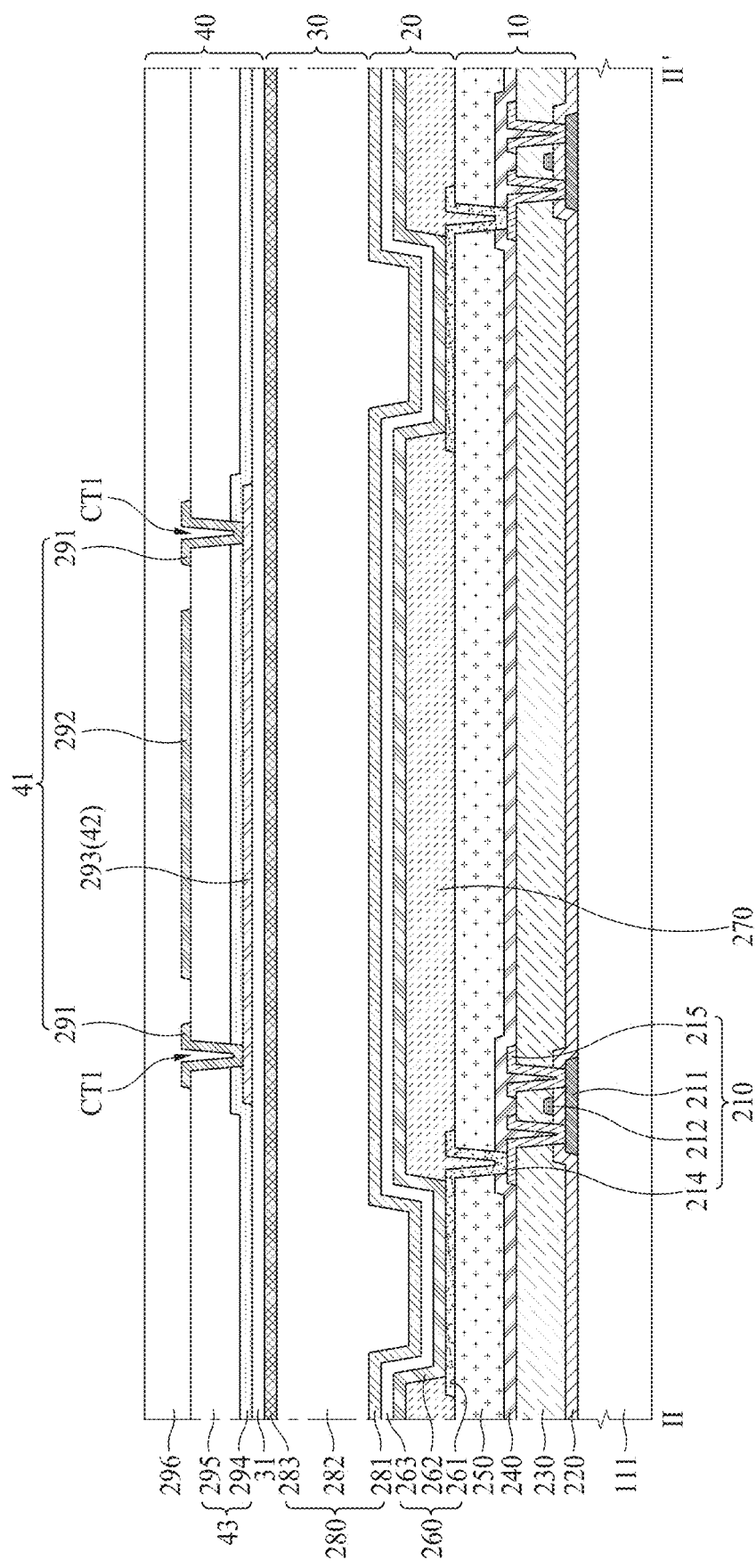

Fourth, as in FIG. 10D, a plurality of first touch electrodes 291 and a plurality of second touch electrodes 292 may be formed on the touch insulation layer 43.

In detail, a fifth metal layer may be formed on a whole surface of the touch insulation layer 43 by using a sputtering process, an MOCVD process, and/or the like. Subsequently, the first and second touch electrodes 291 and 292 may be formed by patterning the fifth metal layer through a mask process using a photoresist pattern. The first touch electrodes 291 may be connected to the bridge electrode 291 through the first contact hole CT1 passing through the touch inorganic layer 291 and the touch organic layer 295. The first and second touch electrodes 291 and 292 may each be formed in a multi-layer structure including a plurality of electrodes, and for example, may be formed in a three-layer structure of Ti/Al/Ti.

A first touch line TL may extend from the first touch electrode 291, and a second touch line RL may extend from the second touch electrode 292. The first touch line TL, as in FIG. 7, may be connected to the first touch pad TP through the second contact hole CT2 which passes through the passivation layer 240 and the second buffer layer 31. The second touch line RL may be connected to the second touch pad RP through the third contact hole CT3 which passes through the passivation layer 240 and the second buffer layer 31.

The first touch electrodes 291, the second touch electrodes 292, the first touch line TL, and the second touch line RL may each be formed of a single layer or a multilayer which includes one of Mo, Al, Cr, Au, Ti, Ni, Nd, and Cu, or an alloy thereof.

Moreover, an overcoat layer 296 for planarizing a step height caused by the first and second touch electrodes 291 and 292 and the bridge electrodes 293 may be formed on the first and second touch electrodes 291 and 292. (S104 of FIG. 9)

Moreover, a color filter layer may be formed on the touch sensing layer 40. The color filter layer may include a plurality of color filters, disposed to overlap subpixels SP, and a black matrix disposed to overlap the bank 270. In a case where the light emitting layer 262 includes a plurality of organic light emitting layers which emit red, green, and blue lights, the color filter layer may be omitted.

Subsequently, the first substrate 111 may be attached on the second substrate 112 by an adhesive layer 50. The adhesive layer 50 may be an OCR layer, an OCA film, or the like.

As described above, in the present embodiment, the touch inorganic layer 294 may be formed on the bridge electrodes 293 of the second touch electrode layer 42, and then, the touch organic layer 295 may be formed on the touch inorganic layer 294. In the embodiments of the present disclosure, since an interface adhesive force between the bridge electrodes 293 and the touch inorganic layer 294 is higher than an interface adhesive force between the bridge electrodes 293 and the touch organic layer 295, the touch organic layer 295 is prevented from being partially detached between the bridge electrodes 293 and the touch organic layer 295.

As described above, according to the embodiments of the present disclosure, the touch inorganic layer may be formed on the bridge electrodes of the second touch electrode layer, and then, the touch organic layer may be formed on the touch inorganic layer. In the embodiments of the present disclosure, since an interface adhesive force between the bridge electrodes and the touch inorganic layer is higher than an interface adhesive force between the bridge electrodes and the touch organic layer, the touch organic layer is prevented from being partially detached between the bridge electrodes and the touch organic layer.

It will be apparent to those skilled in the art that various modifications and variations can be made in the present disclosure without departing from the spirit or scope of the disclosures. Thus, it is intended that the present disclosure covers the modifications and variations of this disclosure provided they come within the scope of the appended claims and their equivalents.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A display device comprising:
a substrate including a display area in which a plurality of pixels are provided and a non-display area adjacent to the display area;
a pad disposed in the non-display area of the substrate;
a light emitting device layer disposed in the display area of the substrate;
a dam on the substrate, the dam being disposed between the display area and the pad;
an encapsulation layer on the light emitting device layer, the encapsulation layer including a first inorganic layer disposed on the light emitting device layer, a second inorganic layer disposed on the first inorganic layer, and an organic layer disposed between the first inorganic layer and the second inorganic layer;
a plurality of first touch electrodes disposed on the second inorganic layer of the encapsulation layer and arranged in a first direction;
a plurality of second touch electrodes disposed on the second inorganic layer of the encapsulation layer and arranged in a second direction intersecting the first direction;

a bridge electrode connecting two of the plurality of first touch electrodes; and a touch insulation layer including a touch inorganic layer covering the bridge electrode, and a touch organic layer disposed on the touch inorganic layer, wherein the second inorganic layer of the encapsulation layer covers the dam, the first touch electrodes and the second touch electrodes are disposed on a same layer, and the bridge electrode is disposed on a layer different from the layer on which the first touch electrodes and the second touch electrodes are disposed, and the bridge electrode is respectively connected to the first touch electrodes adjacent to each other through a contact hole of the touch inorganic layer and the touch organic layer.

2. The display device of claim 1, wherein the first touch electrodes are connected to each other in the first direction through the bridge electrode, and the second touch electrodes are connected to each other in the second direction.

3. The display device of claim 1, wherein the pad including a first touch pad electrically connected to the first touch electrodes and a second touch pad electrically connected to the second touch electrodes.

4. A display device comprising:

a substrate including a display area in which a plurality of pixels are provided and a non-display area adjacent to the display area;

a pad disposed in the non-display area of the substrate;

a light emitting device layer disposed in the display area of the substrate;

a dam on the substrate, the dam being disposed between the display area and the pad;

an encapsulation layer on the light emitting device layer, the encapsulation layer including a first inorganic layer disposed on the light emitting device layer, a second inorganic layer disposed on the first inorganic layer, and an organic layer disposed between the first inorganic layer and the second inorganic layer;

a plurality of first touch electrodes disposed on the second inorganic layer of the encapsulation layer and arranged in a first direction;

a plurality of second touch electrodes disposed on the second inorganic layer of the encapsulation layer and arranged in a second direction intersecting the first direction;

a bridge electrode connecting two of the plurality of first touch electrodes;

a touch insulation layer including a touch organic layer covering the bridge electrode disposed; and a buffer layer disposed between the second inorganic layer of the encapsulation layer and the bridge electrode, wherein the second inorganic layer of the encapsulation layer covers the dam, and the first touch electrodes and the second touch electrodes are disposed on a same layer, and the bridge electrode is disposed on a layer different from the layer on which the first touch electrodes and the second touch electrodes are disposed.

5. The display device of claim 4, wherein the buffer layer covers the dam and a lateral surface of the second inorganic layer, and the touch insulation layer further comprises a touch inorganic layer disposed between the bridge electrode and the touch organic layer.

6. The display device of claim 3, further comprising:

a first touch line extending from the first touch electrodes, the first touch line being connected to the first touch pad; and a second touch line extending from the second touch electrodes, the second touch line being connected to the second touch pad.

7. The display device of claim 6, wherein the second touch line covers the dam.

8. The display device of claim 1, wherein the touch insulation layer is disposed between the bridge electrode and the first and second touch electrodes.

* * * * *